(12) United States Patent
Franke et al.

(10) Patent No.: US 11,971,506 B2
(45) Date of Patent: Apr. 30, 2024

(54) LIGHT PROPAGATION TIME PIXEL AND LIGHT PROPAGATION TIME SENSOR WITH CORRESPONDING PIXEL

(71) Applicant: PMDTECHNOLOGIES AG, Siegen (DE)

(72) Inventors: Matthias Franke, Haiger (DE); Robert Rössler, Berlin (DE)

(73) Assignee: PMDTECHNOLOGIES AG, Siegen (DE)

( * ) Notice: Subject to any disclaimer, the term of this patent is extended or adjusted under 35 U.S.C. 154(b) by 678 days.

(21) Appl. No.: 17/263,206

(22) PCT Filed: Aug. 30, 2019

(86) PCT No.: PCT/EP2019/073170
§ 371 (c)(1),
(2) Date: Jan. 26, 2021

(87) PCT Pub. No.: WO2020/052992
PCT Pub. Date: Mar. 19, 2020

(65) Prior Publication Data
US 2021/0141068 A1    May 13, 2021

(30) Foreign Application Priority Data

Sep. 10, 2018   (DE) .................... 10 2018 122 030.8

(51) Int. Cl.
*G01S 7/4865*     (2020.01)
*G01S 17/36*      (2006.01)
*G01S 17/894*     (2020.01)
*H01L 27/146*     (2006.01)

(52) U.S. Cl.
CPC ............ *G01S 7/4865* (2013.01); *G01S 17/36* (2013.01); *G01S 17/894* (2020.01); *H01L 27/14643* (2013.01)

(58) Field of Classification Search
CPC .... G01S 7/4865; G01S 7/4863; G01S 7/4816; G01S 17/36; G01S 17/894; G01S 17/89
See application file for complete search history.

(56) References Cited

U.S. PATENT DOCUMENTS 7,012,738 B1    3/2006  Schwarte
8,513,753 B1    8/2013  Jenne
(Continued)

FOREIGN PATENT DOCUMENTS

CN       1461518 A    12/2003
CN     101545771 A     9/2009
(Continued)

*Primary Examiner* — Thanh Luu
(74) *Attorney, Agent, or Firm* — Harness, Dickey & Pierce, P.L.C.

(57) ABSTRACT

The disclosure relates to a light propagation time pixel, comprising modulation gates and integration nodes which are arranged on the upper face of a photosensitive semiconductor region. The photosensitive semiconductor region is designed as an N-epitaxy and is delimited laterally and/or at the corners by p-doped vertical p-structures. A buried layer with a p-doping adjoins the lower face of the photosensitive semiconductor region, and the vertical p-structures are in electric contact with the buried layer.

5 Claims, 8 Drawing Sheets

(56) References Cited

U.S. PATENT DOCUMENTS

| | | | |
|---|---|---|---|
| 2009/0114919 A1* | 5/2009 | Kawahito | H01L 27/14643 257/E27.15 |
| 2009/0166684 A1* | 7/2009 | Yahav | H01L 27/1461 257/431 |
| 2010/0060970 A1 | 3/2010 | Chen | |
| 2010/0290028 A1 | 11/2010 | Tachino et al. | |
| 2011/0169991 A1 | 7/2011 | Ku et al. | |
| 2012/0235212 A1 | 9/2012 | Chen et al. | |
| 2014/0103410 A1 | 4/2014 | Chen et al. | |
| 2016/0118432 A1 | 4/2016 | Cazaux et al. | |

FOREIGN PATENT DOCUMENTS

| | | |
|---|---|---|
| CN | 102170529 A | 8/2011 |
| CN | 103576344 A | 2/2014 |
| CN | 103730397 A | 4/2014 |
| CN | 106537174 A | 3/2017 |
| CN | 107026207 A | 8/2017 |
| CN | 107424928 A | 12/2017 |
| CN | 107591454 A | 1/2018 |
| CN | 207037088 U | 2/2018 |
| DE | 19704496 A1 | 3/1998 |
| DE | 19704496 C2 | 2/2001 |
| DE | 102011056369 A1 | 6/2013 |
| DE | 102016211053 A1 | 12/2016 |
| DE | 102017125931 A1 | 5/2018 |
| EP | 2244296 A2 | 10/2010 |
| WO | WO-2004044994 A2 | 5/2004 |
| WO | WO-2014183982 A1 | 11/2014 |

* cited by examiner

Prior art

LIGHT PROPAGATION TIME PIXEL AND LIGHT PROPAGATION TIME SENSOR WITH CORRESPONDING PIXEL

CROSS-REFERENCE TO RELATED APPLICATIONS

This application is a U.S. National Phase Application under 35 U.S.C. 371 of International Application No. PCT/EP2019/073170, filed on Aug. 30, 2019, which claims the benefit of German Patent Application No. 10 2018 122 030.8, filed on Sep. 10, 2018. The entire disclosures of the above applications are incorporated herein by reference.

FIELD

The disclosure relates to a light propagation time pixel and a light propagation time sensor according to the preamble of the independent claims.

BACKGROUND

This section provides background information related to the present disclosure which is not necessarily prior art.

Light propagation time pixels are known, for example, from document DE 197 04 496 C2, which, among others, also shows a typical structure of such a photonic mixing element, that is to say of an individual pixel of a photonic mixer. A photonic mixing detector or PMD sensor (PMD: Photonic Mixing Device) means an optical sensor whose functional principle is based on the Time of Flight method (TOF: Time of Flight) and, in connection with the present disclosure, is to be subsumed under the term light propagation time pixel or light propagation time sensor comprising several light propagation time pixels.

SUMMARY

This section provides a general summary of the disclosure, and is not a comprehensive disclosure of its full scope or all of its features.

The object of the disclosure is to improve the properties of a light propagation time pixel, in particular for very small pixels.

The object is achieved by the light propagation time pixel according to the disclosure. Advantageous embodiments of the disclosure are specified in the sub-claims.

Advantageously, a light propagation time pixel is provided comprising modulation gates and integration nodes disposed at a top side of a photosensitive semiconductor region,
  wherein the photosensitive semiconductor region is formed as an n-epitaxy, and is laterally and/or at its corners delimited by p-doped vertical p-structures,
  wherein at a bottom side of the photosensitive semiconductor region a buried layer with a p-doping adjoins,
  wherein the vertical columnar p-structures, in particular p-columns, are in electrical contact with the buried layer.

This structure results in an alternating doping course in the horizontal direction which has a favorable effect on the electrical potential in such a way that photo-generated charge carriers are focused horizontally in the direction of the pixel center and accelerated vertically in the direction of the modulation gates.

It is further provided that the buried layer is followed by a p-doped semiconductor carrier, wherein on this semiconductor carrier a contact for a reference potential is disposed.

Compared to a ground contact on the top side of the semiconductor, this has the advantage that the electrical field is set favorably in the direction of the modulation gates and integration nodes via the Vbias contact on the back side of the semiconductor.

In a further embodiment it is provided to dispose p-doped regions on the top side of the light propagation time pixel laterally to the photosensitive region, wherein the p-doped regions are designed as p-wells, wherein the p-structures are in electrical contact with the p-wells.

This advantageously results in a p-structure surrounding the entire photosensitive area.

In a further embodiment it is advantageously provided to arrange the p-structures at an interface of a trench.

It is particularly advantageous to configure a light propagation time sensor with an array of pixels of the aforementioned type.

Further areas of applicability will become apparent from the description provided herein. The description and specific examples in this summary are intended for purposes of illustration only and are not intended to limit the scope of the pre-sent disclosure.

DRAWINGS

The drawings described herein are for illustrative purposes only of selected embodiments and not all possible implementations, and are not intended to limit the scope of the present disclosure.

The disclosure is explained below in more detail based on exemplary embodiments with reference to the drawings.

In the drawings.

In the following description of the preferred embodiments, the same reference symbols designate the same or comparable components.

DETAILED DESCRIPTION

Example embodiments will now be described more fully with reference to the accompanying drawings.

Figure 1:
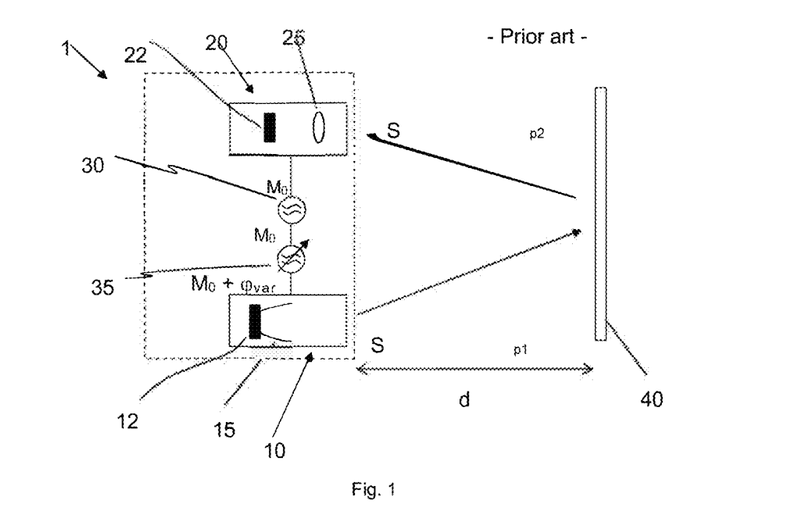
FIG. 1 schematically shows a light propagation time camera system.

FIG. 1 shows a measuring situation for an optical distance measurement with a light propagation time camera, as it is known for example from DE 197 04 496 A1.

The light propagation time camera system 1 comprises a transmission unit or an illumination module 10 with an illumination 12 and an associated beam shaping optics 15 and a receiving unit or light propagation time camera 20 comprising a receiving optics 25 and a light propagation time sensor 22.

The light propagation time sensor 22 comprises at least one light propagation time pixel, preferably a pixel array, and is configured in particular as a PMD sensor. The receiving optics 25 consists typically of several optical elements in order to improve the imaging properties. The beam shaping optics 15 of the transmission unit 10 can be designed as reflector or lens optics, for example. In a very simple embodiment, optical elements on both the receiving and transmission sides can optionally be dispensed with.

The measuring principle of this arrangement is essentially based on the fact that, based on the phase shift of the emitted and received light, the propagation time and thus the distance covered by the received light can be determined. For this purpose, the light source 12 and the light propagation time sensor 22 are supplied in common with a certain modulation signal $M_0$ with a base phase $\varphi_0$ via a modulator 30. In the example shown, moreover, a phase shifter 35 is provided between the modulator 30 and the light source 12, by means of which the base phase $\varphi_0$ of the modulation signal $M_0$ of the light source 12 can be shifted by defined phasings $\varphi_{var}$. For typical phase measurements, preferably phasings of $\varphi_{var}=0°$, 90°, 180°, 270° are used.

According to the set modulation signal, the light source 12 emits an intensity-modulated signal $S_{p1}$ with the first phasing p1 or $p1=\varphi_0+\varphi_{var}$. This signal $S_{p1}$ or the electromagnetic radiation is reflected in the illustrated case by an object 40 and hits due to the distance traveled with a correspondingly phase shift $\Delta\varphi(t_L)$ with a second phasing $p2=\varphi_0+\varphi_{var}+\Delta\varphi(t_L)$ as a received signal $S_{p2}$ onto the light propagation time sensor 22. In the light propagation time sensor 22 the modulation signal $M_0$ is mixed with the received signal $S_{p2}$, wherein the phase shift or the object distance d is determined from the resulting signal.

Infrared light-emitting diodes or laser diodes, for example, are suitable as the illumination source or light source 12. Of course, other emission sources in other frequency ranges are conceivable, in particular light sources in the visible frequency range are possible.

Figure 2:
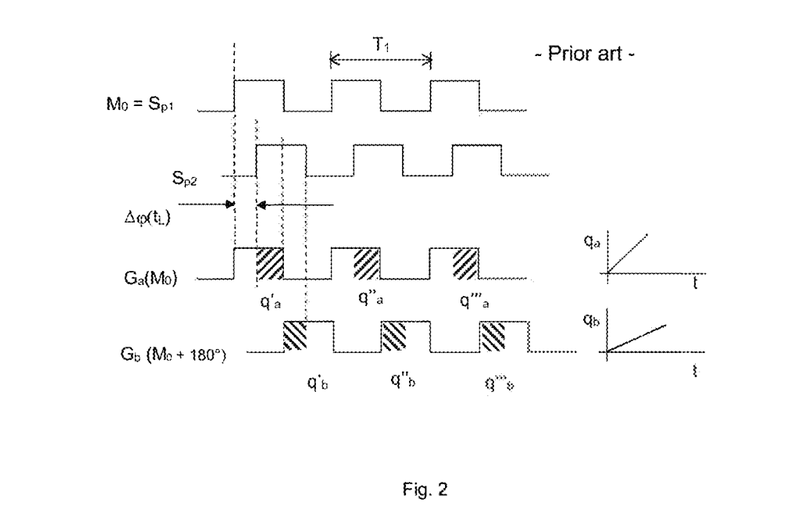
FIG. 2 shows a modulated integration of generated charge carriers.

The basic principle of phase measurement is shown schematically in FIG. 2. The upper curve shows the time profile of the modulation signal $M_0$ by means of which the light source 12 and the light propagation time sensor 22 are driven. The light reflected by the object 40 hits onto the light propagation time sensor 22 as a received signal $S_{P2}$ with a phase shift $\Delta\varphi(t_L)$ corresponding to its light propagation time $t_L$. The light propagation time sensor 22 accumulates the photonically generated charges q over several modulation periods in the phasing of the modulation signal $M_0$ in a first integration node Ga and in a phasing $M_0+180°$ shifted by 180° in a second integration node Gb. The phase shift $\Delta\varphi(t_L)$ and thus a distance d of the object can be determined from the ratio of the charges qa, qb accumulated in the first and second nodes Ga, Gb 104.

Figure 3:
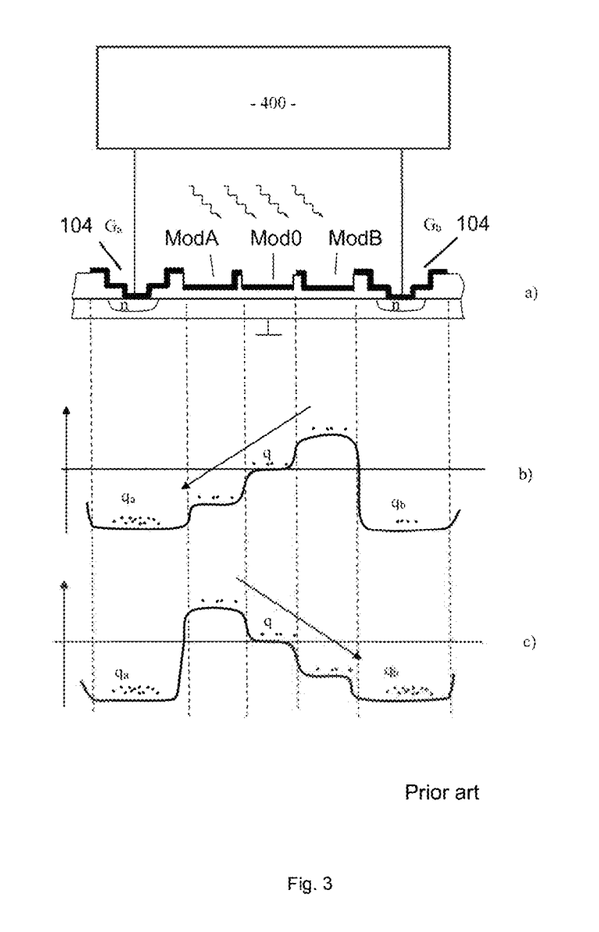
FIG. 3 shows a cross section through a PMD light propagation time pixel with a potential distribution.

FIG. 3 shows a cross section through a pixel of a photonic mixing detector as it is known, for example, from DE 197 04 496 C2. The modulation photogates ModA, Mod0, ModB form the light-sensitive area of a PMD pixel. According to the voltage applied to the modulation gates ModA, Mod0, ModB, the photonically generated charges q are directed either to the one or to the other of the accumulation gate or integration node Ga, Gb. The integration nodes can be configured as a gate or as a diode.

FIG. 3b shows a potential profile in which the charges q flow in the direction of the first integration node Ga, while the potential according to FIG. 3c allows the charge q to flow in the direction of the second integration node Gb. The potentials are specified according to the applied modulation signals. Depending on the application, the modulation frequencies are preferably in a range from 1 to 100 MHz. With a modulation frequency of 1 MHz, for example, a period duration of one microsecond results, so that the modulation potential changes accordingly every 500 nanoseconds.

FIG. 3a shows a read-out unit 400 which optionally can already be part of a PMD light propagation time sensor configured as CMOS. The integration nodes Ga, Gb configured as capacitances or diodes integrate the photonically generated charges over a large number of modulation periods. In a known manner, the voltage then provided at the nodes Ga, Gb can be tapped off at high impedance, for example via the read-out unit 400. The integration times should preferably be selected so that the light propagation time sensor or the integration nodes and/or the light-sensitive areas do not become saturated for the expected amount of light.

The basic idea of the disclosure is based on the concept of charge compensation in the context of imaging sensors. Alternating p and n-regions allow an at least partial compensation of charges in the case of depletion. This makes it possible to optimize the vertical potential profile even for small PMD dimensions.

Figure 4:
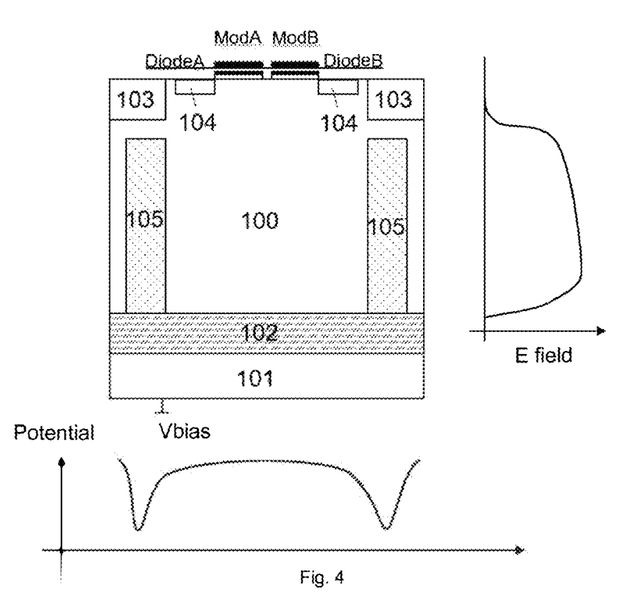
FIG. 4 shows a light propagation time pixel according to the disclosure with p-columns.

FIG. 4 illustrates the basic construction: an n-epitaxy 100 for providing a photosensitive region for a PMD light propagation time pixel is delimited by p-doped "columns" or vertical doping regions 105 to all sides (left, right, front, back) and to the bottom by a buried p-doped layer 102 or horizontal p-doping region 102. At the top side of the n-epitaxy 100 modulatable photogates ModA, ModB and integration nodes DiodeA, DiodeB, 104 are disposed. Furthermore, at the top side of the light propagation time pixel a p-doped region 103, so-called CMOS p-wells 103, is arranged which laterally delimits the photosensitive area 100. In contrast to the conventional PMD pixel, the reference potential is not applied at the top side, but at the bottom side of the component at a Vbias contact. In the example shown, the component is build up on a p-doped base wafer.

The vertical doping regions 105 extend vertically below the p-wells 103. The vertical doping regions 105 contact the p-doped buried layer 102 and can partially or completely enclose the n-epitaxy 100 towards the surface. In the embodiment according to FIG. 4, a distance is provided between the vertical doping regions 105 and the p-wells 103. P-well 103 and the vertical doping regions 105 preferably have different dopant concentrations.

By means of the doping regions (p-n-p) alternating in the horizontal direction and with a suitable choice of the doping levels, an ideal profile of the electrical potential in the vertical direction is obtained. At the same time, it is strongly centered in the horizontal direction within a pixel. In this way a strong horizontal centering of the photoelectrons with simultaneous high vertical drift is achieved. At the surface, the photoelectrons hit onto the well-known charge carrier swing of the modulated photogates ModA, ModB and are directed into the integration diodes 104A and B according to the phasing and accumulated there.

The doping of the n-epitaxy 100 and of the surrounding p-columns 105 is set in such a way that the desired potential or field profile is established. In the embodiment shown, a bias voltage Vbias is applied at the rear side or bottom side of the component.

In addition to a high vertical drift field, moreover, a strong centering on the center of the component is achieved, which significantly reduces the lateral crosstalk of the component. Ultimately, this enables also to achieve a high performance even for small PMD components.

Figure 5:
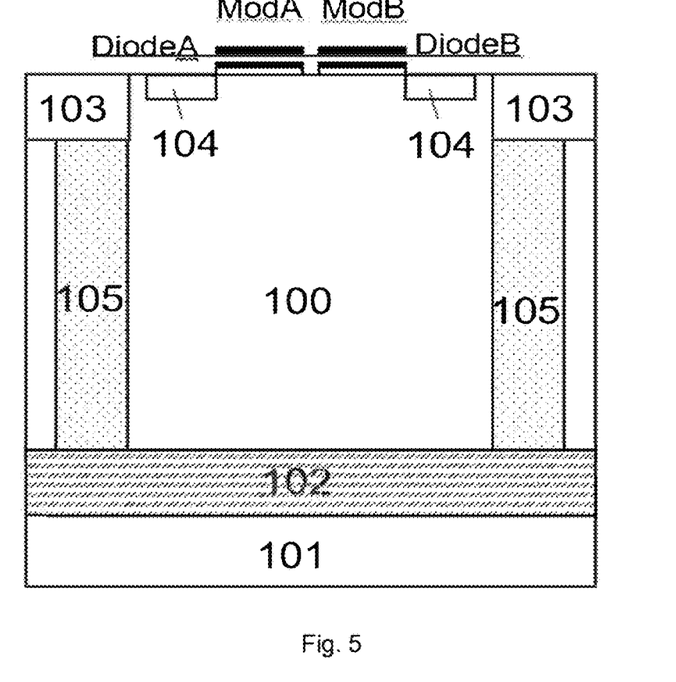
FIG. 5 shows a light propagation time pixel with p-columns that contact the p-well.

FIG. 5 shows a variant in which the vertical doping regions 105 contact the p-wells 103 and thus establish an electrically conductive connection to the buried p-layer 102.

Figure 6:
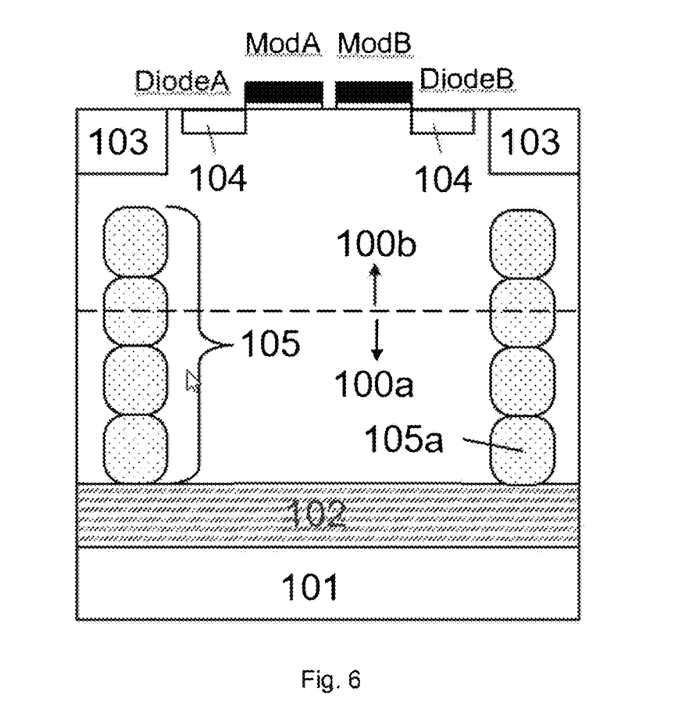
FIG. 6 shows a light transit time pixel in which the p-columns are built up in individual implants.

FIG. 6 shows a variant in which the vertical p-regions or columns 105 are built up in the form of stacked individual implants. The individual implants and the n-epitaxy 100 can advantageously selected and build up in their dopant concentration so that at least a partial charge compensation and, as a result, an ideal potential distribution is established. In particular, the n-epitaxy 100 can have a dopant gradient in the vertical direction. For example, the region 100b can have a higher dopant concentration than the region 100a. Moreover, a continuous gradient is conceivable such that the dopant concentration decreases in the vertical direction with increasing distance from the modulation gates ModA, ModB.

Figure 7:
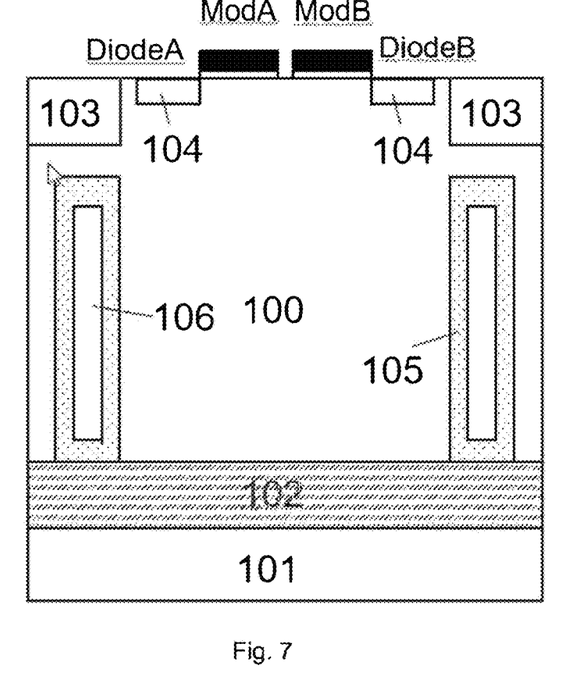
FIG. 7 shows a light propagation time pixel with p-columns on a trench.

FIG. 7 shows a structure of a vertical p-region in the form of a passivation of a trench, such as is used, for example, to suppress optical crosstalk. To protect a sensor from unwanted dark current, the side walls of the trench are passivated with a p-implant. This protective implant can also be used as a p-column or vertical p-region.

Figure 8:
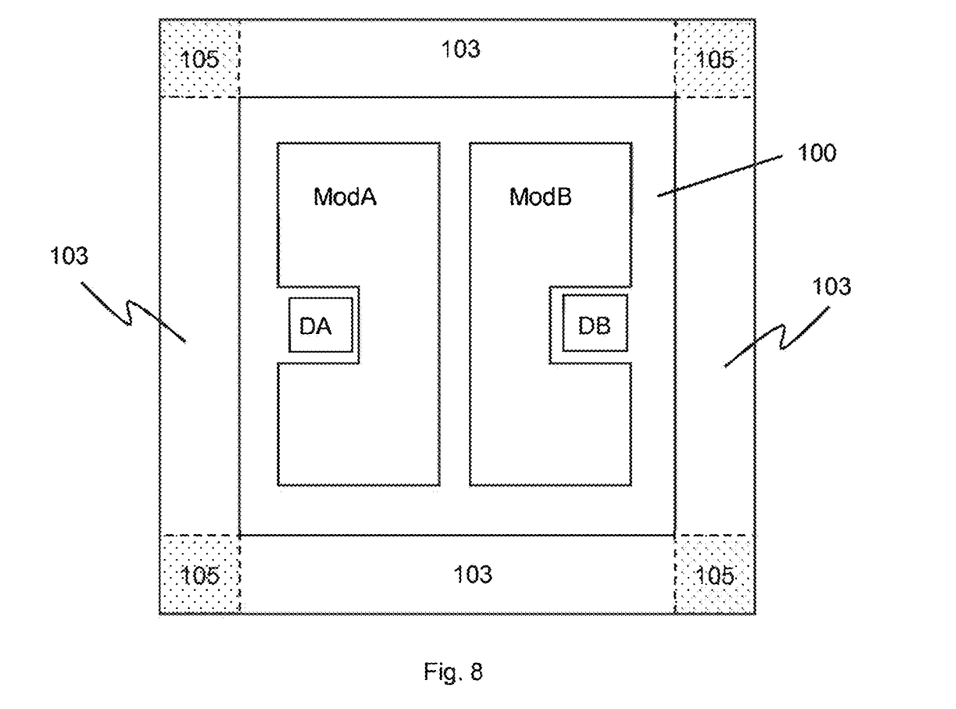
FIG. 8 shows a plan view of a pixel according to FIGS. 4-6 with p-columns arranged in the corner area.

FIG. 8 shows a top view of a pixel structure according to FIGS. 4 to 6, in which the vertical p-regions 105 are arranged as p-columns at the corner points of the pixel outline. The CMOS p-wells 103 for accommodating further semiconductor functions extend at the edge of the photosensitive region 100. Preferably, but not necessarily, the modulation gates ModA, ModB comprise a recess in which the integration nodes 104 DA, DB or diodes DiodeA, DiodeB are arranged.

Figure 9:
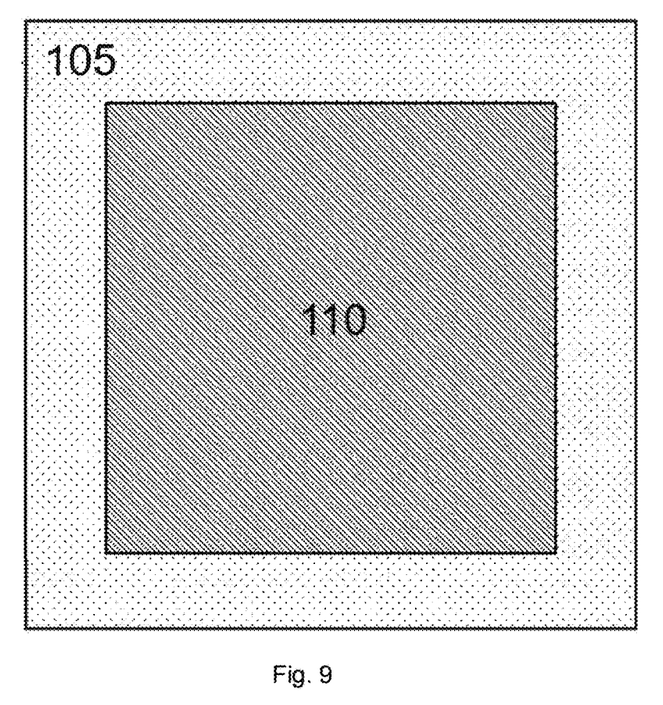
FIG. 9 shows a plan view of a pixel according to FIGS. 4-6 with a p-region enclosing the n-epitaxy.

FIG. 9 shows a plan view of a pixel structure according to FIGS. 4 to 6, in which the vertical p-regions enclose the entire pixel outline.

Figure 10:
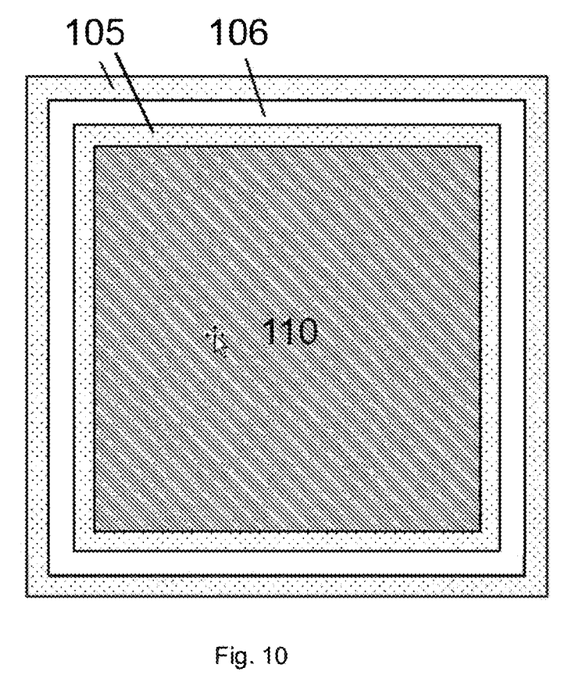
FIG. 10 shows a top view of a pixel according to FIG. 7.

FIG. 10 shows a top view of a pixel structure according to FIG. 7 with a circumferential trench insulation 106 and protective implant as p-region 105.

Figure 11:
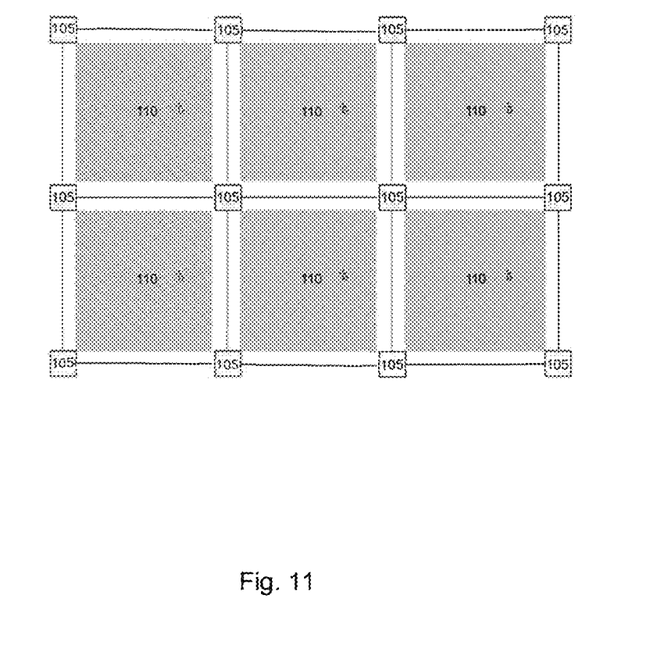
FIG. 11 shows a top view of a sensor structure with several pixels according to FIG. 8.

FIG. 11 shows a light propagation time sensor comprising several pixels according to FIG. 8, in which the p-columns 105 are arranged in the corner region of a light propagation time pixel.

Figure 12:
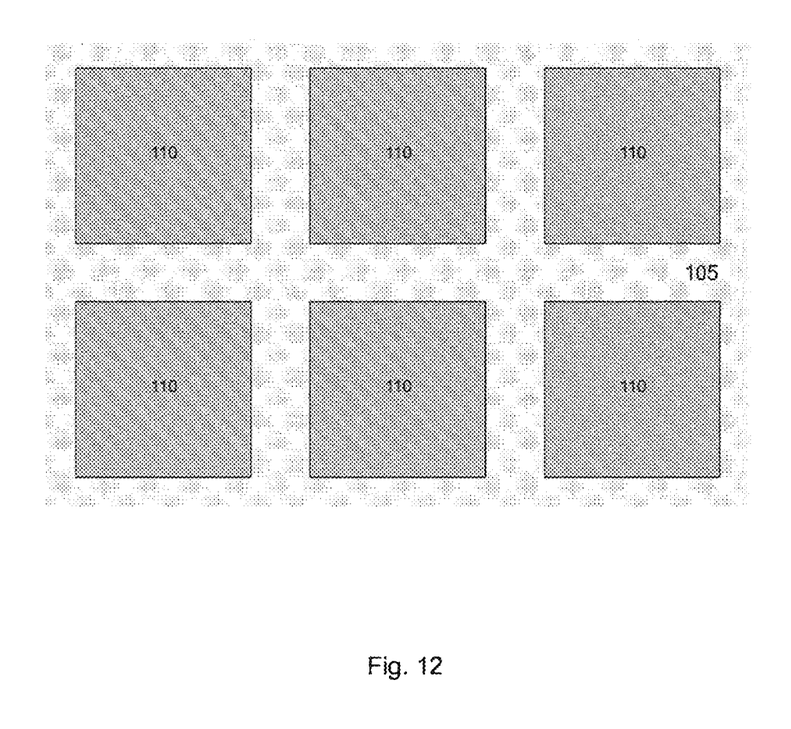
FIG. 12 shows a top view of a sensor structure with several pixels according to FIG. 9.

FIG. 12 shows a light propagation time sensor comprising a plurality of pixels, in which the p-columns 105 are arranged as vertical p-structures 105 around the pixels.

Figure 13:
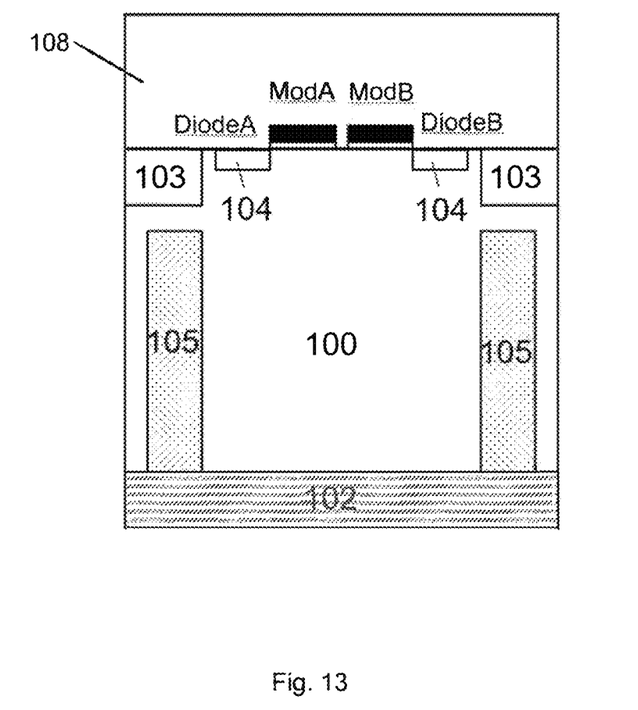
FIG. 13 shows a cross section of a pixel according to FIG. 4 for backside illumination.

FIG. 13 shows exemplarily a variant of the embodiment according to FIG. 4, which is configured as a so-called backside illuminated, BSI, pixel. The pixel structure in this case has typically been applied on a further carrier substrate 108, wherein the original carrier substrate 101 has been thinned out. Of course, the BSI structure can also be realized with the other illustrated embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are inter-changeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A light propagation time pixel comprising modulation gates and integration nodes disposed at a top side of a photosensitive semiconductor region,
    wherein the photosensitive semiconductor region is formed as n-epitaxy and laterally and/or at its corners delimited by p-doped vertical p-structures,
    wherein a buried layer with a p-doping adjoins a bottom side of the photosensitive semiconductor region,
    wherein the vertical p-structures are in electrical contact with the buried layer, and
    wherein the buried layer is followed by a p-doped semiconductor carrier.

2. The light propagation time pixel according to claim 1, in which on the semiconductor carrier a contact for a reference potential is arranged.

3. The light propagation time pixel according to claim 1, in which the p-structures are arranged at an interface of a trench.

4. The light propagation time sensor comprising a light propagation time pixel according to claim 1.

5. A light propagation time pixel comprising modulation gates and integration nodes disposed at a top side of a photosensitive semiconductor region,
    wherein the photosensitive semiconductor region is formed as n-epitaxy and laterally and/or at its corners delimited by p-doped vertical p-structures,
    wherein a buried layer with a p-doping adjoins a bottom side of the photosensitive semiconductor region,
    wherein the vertical p-structures are in electrical contact with the buried layer, in which on the top side of the light propagation time pixel laterally to the photosensitive region p-doped regions are arranged and configured as p-wells and the p-structures are in electrical contact with the p-wells.

* * * * *